(12) United States Patent
Lassalle

(10) Patent No.: US 10,396,764 B2
(45) Date of Patent: Aug. 27, 2019

(54) HIGH-VOLTAGE PULSE GENERATOR

(71) Applicant: COMMISSARIAT A L'ENERGIE ATOMIQUE ET AUX ENERGIES ALTERNATIVES, Paris (FR)

(72) Inventor: Francis Lassalle, Saint-Jean Lespinasse (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 44 days.

(21) Appl. No.: 15/558,253

(22) PCT Filed: Mar. 15, 2016

(86) PCT No.: PCT/EP2016/055593
§ 371 (c)(1),
(2) Date: Sep. 14, 2017

(87) PCT Pub. No.: WO2016/146635
PCT Pub. Date: Sep. 22, 2016

(65) Prior Publication Data
US 2018/0048299 A1  Feb. 15, 2018

(30) Foreign Application Priority Data
Mar. 16, 2015  (FR) ..................... 15 52131

(51) Int. Cl.
*H03K 3/537* (2006.01)
*H03K 3/53* (2006.01)
(Continued)

(52) U.S. Cl.
CPC ............. *H03K 3/537* (2013.01); *H01B 17/28* (2013.01); *H01B 17/42* (2013.01); *H01B 17/62* (2013.01);
(Continued)

(58) Field of Classification Search
CPC ........ H01B 17/28; H01B 17/42; H01B 17/62; H03K 3/53; H03K 3/537; H03K 3/57
(Continued)

(56) References Cited

U.S. PATENT DOCUMENTS 4,305,000 A * 12/1981 Cheever .................. H01J 37/00
250/492.1
4,367,412 A   1/1983 Cheever
(Continued)

OTHER PUBLICATIONS

International Search Report dated Apr. 26, 2016 in PCT/EP2016/055593 filed Mar. 15, 2016.
(Continued)

*Primary Examiner* — William Hernandez
(74) *Attorney, Agent, or Firm* — Oblon, McClelland, Maier & Neustadt, L.L.P.

(57) ABSTRACT

A high-voltage pulse generator including a plurality of stages and an electrode for returning current to ground, connected in series, each of the stages including at least one energy storage element connected in series with a spark gap. The spark gaps are distributed on an axis, the odd-numbered energy storage elements are arranged on one side of the spark gap axis, and the even-numbered energy storage elements are arranged on the other side of the spark gap axis, such that the circuit formed by the plurality of stages and the current return electrode have a reduced inductance during a discharge phase of the generator, with respect to a generator including the same components laid out according to a conventional architecture.

10 Claims, 2 Drawing Sheets

(51) Int. Cl.
*H01B 17/28* (2006.01)
*H01B 17/42* (2006.01)
*H01B 17/62* (2006.01)
*H01R 13/53* (2006.01)
*H02N 2/18* (2006.01)

(52) U.S. Cl.
CPC .............. *H03K 3/53* (2013.01); *H01R 13/53* (2013.01); *H02N 2/183* (2013.01)

(58) Field of Classification Search
USPC .................................................. 307/106, 108
See application file for complete search history.

(56) References Cited

U.S. PATENT DOCUMENTS

| 4,439,686 | A | * | 3/1984 | Cheever | H01J 37/00 174/18 |
|---|---|---|---|---|---|
| 4,645,941 | A | | 2/1987 | Nicolas | |
| 5,621,255 | A | | 4/1997 | Leon et al. | |
| 7,989,987 | B2 | | 8/2011 | Mcdonald | |
| 2008/0191559 | A1 | * | 8/2008 | Staines | F41H 13/0068 307/108 |
| 2015/0108852 | A1 | * | 4/2015 | Hizal | H03K 3/537 307/108 |
| 2015/0270831 | A1 | * | 9/2015 | Volkov | H03K 3/53 307/108 |

OTHER PUBLICATIONS

French Search Report dated Jan. 21, 2016 in FR1552131 filed Mar. 16, 2015.
Shkaruba, M.V. et al., "Arkad' EV-Marx Generator with Capacitive Coupling," Instruments and Experimental Techniques, Consultants Bureau, vol. 3, Part 2, No. 28, May 1985, XP002080293, 4 pages.

* cited by examiner

HIGH-VOLTAGE PULSE GENERATOR

TECHNICAL FIELD

This invention relates to the generating of high-power electric pulses, referred to as "high pulsed power".

It relates more particularly to a Marx generator.

PRIOR ART

Generally, a Marx generator is an electrical circuit intended to produce a high-voltage pulse.

A conventional Marx generator comprises several stages which are each formed from an energy storage capacitor and a switch. The capacitors are charged in parallel at a charge voltage then they are discharged in series by means of switches, which produces a high-voltage pulse.

During the discharging, the Marx generator delivers its energy at a charge that can be resistive, inductive, capacitive or any combination of these three properties. In what follows, interest shall more particularly be given to the case of a resistive charge.

The space occupied by the Marx generator is linked to the arrangement and to the sizing of its various components.

The discharge pulse rise time is globally proportional to the ratio of the sum of the inductance of the Marx generator and of the inductance of the charge to the resistance of the charge. As the inductance and the resistance of the charge are fixed, an important point for the optimisation of the Marx generator is to minimise its inductance.

The inductance of the Marx generator is linked to the arrangement and to the sizing of the various components of the Marx generator.

Many applications require delivering pulses that have a rising edge that is as reduced as possible, typically less than 10 ns. Most of the known Marx generators do not make it possible to achieve this performance without the use of a pulse smoothing device for making a steep pulse.

A known device for making a steep pulse is the device referred to as "peaking" which combines a capacitor and a very high voltage spark gap, both with a low inductance. The performance and the reliability of such a spark gap can be difficulties, especially when operation in repetitive mode and a substantial service life, for example in terms of the number of pulses, are sought.

Furthermore, such a device occupies a space that increases the space occupied by the Marx generator.

More precisely, the switch of a stage of a Marx generator is either a spark gap or a semiconductor switch. In what follows, interest is given only to the case of the spark gap. A spark gap is formed from two electrodes separated by a dielectric fluid, which is generally a gas or more rarely a liquid. This isolation allows for the charging of the capacitor or capacitors of the stage of the Marx generator. For the discharging, the closing of the spark gap results in the forming of an electric arc between these two electrodes. This closing can be provoked by a self-priming of the arc or be triggered by an external phenomenon, such as an overvoltage coming from a Marx stage located upstream, or a triggered electrical, optical or plasma phenomenon.

Generally, spark gaps operate under pressurised gas and the dimensions of their electrodes are large compared to those of the gap where the electric arc is formed. In order to support these electrodes and contain this pressurised gas, the column of spark gaps can be housed in a dielectric insulating casing. The sizing of this column of spark gaps and the positioning thereof with respect to the current return electrode have a substantial effect on the inductance and therefore on the performance of the system.

In order to contribute to the reduction in the duration of the pulse rising edge delivered by the Marx generator, the sequencing of the closing of the spark gaps is controlled.

For an operation under pressurised gas, this sequencing is improved if the spark gaps are aligned on the same axis. This configuration allows the ultraviolet radiation generated by the arc at the closing of a spark gap to cause the photo-ionisation of the inter-electrode interval of the following spark gap. As such the statistical delay for the closing of the spark gaps is reduced.

A Marx generator is powered by a charging circuit. The charging circuit generally comprises a power supply the voltage of which being low with respect to the output voltage of the Marx generator, a protection circuit and a set of elements distributed around stages in order to allow for the charging of the energy storage capacitors from the power supply.

Furthermore, the mechanical resistance of the various components and subsystems such as stage supports and the charge circuit for example, is provided by dielectric supports. On the surfaces of these solid insulators, the distances between metal electrodes of the various components, which are brought to different potentials, must be sufficient to withstand without breaking down the operating voltages.

The pulse delivered is of the so-called double-exponential or damped form if each stage of the Marx generator comprises a capacitor. In order to obtain a longer pulse, each capacitor of the Marx generator is replaced with a transmission line. In a configuration referred to as PFN for "Pulse Forming Network", a stage of the Marx generator is formed by a network of several cells (L, C), where L designates an inductance and C designates a capacitor.

DISCLOSURE OF THE INVENTION

The invention aims to resolve the problems linked to prior art by providing a high-voltage pulse generator comprising a plurality of stages and a current return electrode for returning to earth connected in series, with each one of the stages comprising at least one energy storage element connected in series with a spark gap, characterised in that The spark gaps are distributed on an axis, The odd-numbered energy storage elements are arranged on one side of the spark gap axis, and The even-numbered energy storage elements are arranged on an other side of the spark gap axis, In such a way that the circuit formed by the plurality of stages and the current return electrode has a reduced inductance during a discharge phase of the generator, with respect to a generator comprising the same components arranged according to a conventional architecture.

This configuration makes it possible to obtain a rising edge of the pulses that is shorter than according to prior art. Indeed, this configuration imposes a zigzag flow of the current in the transmission line formed by the stages of the generator. As such, the magnetic induction vectors are of the opposite direction of a spark gap to its neighbour. The coupling between two antagonist magnetic induction vectors is high. This contributes to the reduction in the inductance.

Furthermore, the current return electrode is arranged as close as possible to the stages, which also contributes to the reduction in the inductance.

The reduction in the inductance of the Marx generator has for effect to reduce the duration of the discharge pulse rising edge, without having recourse to a device for making a steep pulse other than the Marx generator itself.

This zigzag configuration also makes it possible to obtain a Marx generator that is more compact than according to prior art.

According to a preferred characteristic, the output of an upstream energy storage element, the upstream spark gap and the input of a downstream energy storage element are substantially aligned along an axis that is substantially perpendicular to the axis of the column of spark gaps.

This configuration contributes to the limitation of the space occupied by of the Marx generator.

According to a preferred characteristic, the electrodes of the spark gaps are directly connected to the electrodes of the energy storage elements.

According to a preferred characteristic, all of the components of the generator are in a closed metal enclosure that contains a dielectric fluid.

Alternatively, the spark gaps are in an insulating casing containing a dielectric fluid.

According to a preferred characteristic, the current return electrode is formed by the metal enclosure.

According to a preferred characteristic, the current return electrode has a surface greater than or equal to the surface formed by the discharging circuit formed by the plurality of stages.

Alternatively, a dielectric film is arranged between the current return electrode and the discharging circuit formed by the plurality of stages.

According to a preferred characteristic, the distance between the current return electrode and a given stage increases with the rank of the stage.

Alternatively, the distance between the current return electrode and the last stage is such that the impedance for this stage is equal to the impedance of the charge.

In this case, the pulse rising edge is reduced even further.

According to a preferred characteristic, an energy storage element comprises a capacitor.

According to a preferred characteristic, an energy storage element comprises a cell formed from a capacitor and from an inductance. When each stage comprises a network of cells each formed from a capacitor and from an inductance, format a PFN line, it is possible to generate pulses of the crenel type, in single-shot mode as well as in repetitive mode.

BRIEF DESCRIPTION OF THE DRAWINGS

Other characteristics and advantages shall appear when reading the following description of a preferred embodiment, given by way of a non-limiting example, described in reference to the figures wherein.

DETAILED DISCLOSURE OF PARTICULAR EMBODIMENTS

Figure 1:
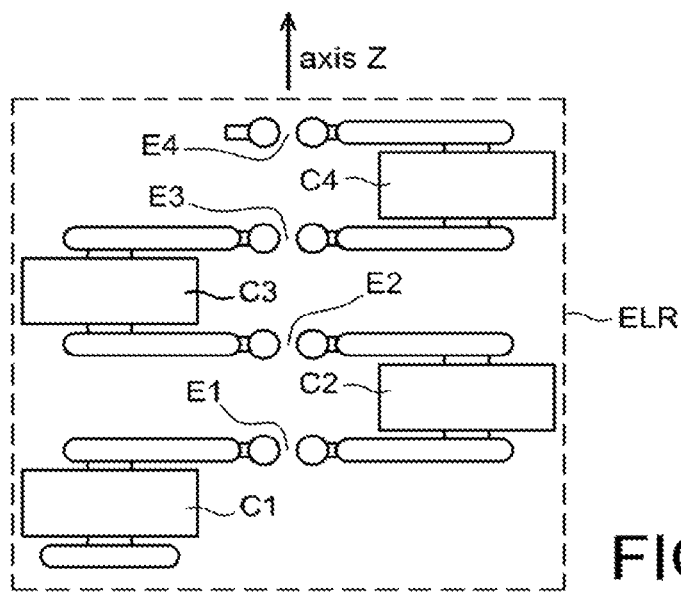
FIG. 1 and FIG. 2 show a Marx generator according to a first embodiment of the invention, FIGS. 3a, 3b and 3c respectively show a side view, a bottom view and a top view of a Marx generator according to a second embodiment of the invention.
Figure 2:
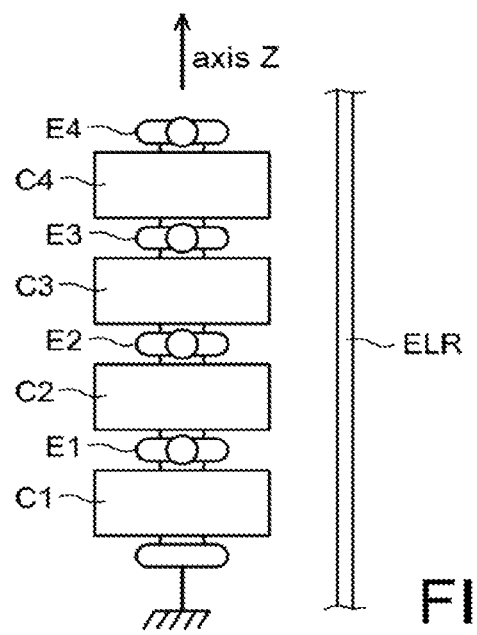

According to a preferred embodiment shown in FIG. 1 and in FIG. 2, a Marx generator comprises N stages, where N is equal to four as an example. Of course, the number of stages can be different.

The input of the generator is connected to the earth. Starting from the input, the generator comprises a capacitor C1 of which the output electrode is connected to the input electrode of a first spark gap E1.

The spark gap E1 has its output electrode connected to the input electrode of a second capacitor C2, and so on for the spark gaps E2, E3 and E4 and for the capacitors C3 and C4.

Alternatively, several capacitors can be connected in parallel over the same stage in order to reduce the impedance and therefore increase the current delivered.

Note that the capacitors used are ceramic capacitors or any other type of capacitor.

A conventional charge circuit, not shown, powers the Marx generator.

In this configuration, the polarity of the output pulse is of the same sign as the polarity of the charge voltage of the capacitors.

Alternatively, the elements are arranged in a different order. Starting from the input connected to the earth, the Marx generator comprises a first spark gap, connected in series with a first capacitor, itself connected in series with a second spark gap, and so on. The output of the Marx generator is the output of the last capacitor. In this case, the polarity of the output pulse is of a sign opposite that of the polarity of the charge voltage of the capacitors.

As can be seen in FIG. 1, the N spark gaps are distributed on an axis Z and form a column.

The odd-numbered capacitors are arranged on one side of the spark gap axis, and the even-numbered capacitors are arranged on an other side of the spark gap axis.

Furthermore, the output of an upstream capacitor, the upstream spark gap and the input of a downstream capacitor are substantially aligned along an axis that is substantially perpendicular to the axis of the column of spark gaps.

The electrodes of the spark gaps are directly fastened to the electrodes of the capacitors. No insulating support or insulating casing are used for the column of spark gaps.

The dimensions of the electrodes of the spark gaps are miniaturised in such a way that the space they occupy according to the axis Z is of the same magnitude as the space occupied by electrodes used for the connecting of capacitors. In practice, this space can be typically between 5 and 15 mm.

For each spark gap, the two electrodes facing can have a spherical, hemispherical, planar or with a curvature defined to obtain a specific electric field topology between electrodes.

In order to minimise the erosion due to the electric arcs, the material of the electrodes of the spark gaps can be a tungsten-copper alloy. Metal electrodes with a tungsten-copper alloy insert located in the vicinity of the electric arc can also be used.

In order to allow for the adjusting of the inter-electrode space, each spark gap electrode is screwed onto the end of the electrode connected to the capacitor. A braking system can be provided on this screwed connection in order to prevent any maladjustment of the inter-electrode space during a burst of pulses.

All of the components, in particular the capacitors and the spark gaps, but also the charging circuit not shown are contained in a single enclosure filled with a dielectric fluid. This can be a pressurised gas such as dry air or SF6 for example, or a liquid. The enclosure is more preferably cylindrical in order to optimise its size while still reducing the forces due to the internal pressure of the gas.

Alternatively, the dielectric medium used for the insulating of the spark gaps can be different from that used for the insulating of the other elements of the Marx generator. In this case, the spark gap column is housed in an insulating casing that separates these two mediums.

The first spark gap E1 is triggered by a controlled external signal. The following spark gaps are not triggered by an external signal. They are closed in the manner of an avalanche, i.e. in a sequential order according to the order of the stages. Alternatively, the number of spark gaps triggered by an external signal can be greater than one.

For an operation under pressurised gas, the ultraviolet radiation will more preferably not be masked along the axis Z. The alignment of the spark gaps along the axis Z allows the ultraviolet radiation generated by the arc at the closing of a spark gap to cause the photo-ionisation of the inter-electrode interval of the following spark gap. As such the statistical delay for the closing of the spark gaps is reduced and the sequencing is improved.

Alternatively, the inter-electrode distance of the spark gaps is adjusted in such a way as to increase with the rank of the stages. This makes it possible to prevent any excessively precocious self-priming of the spark gaps of upper ranks.

For an operation in repetitive mode, i.e. with recurring charging and discharging cycles, a preferred operating mode comprises the inhibition of the charge voltage between two consecutive charging cycles. This inhibition allows for a better extinguishing of the electric arc on each spark gap, which makes it possible to obtain a higher repeatability rate.

For an operation in repetitive mode, it is also possible to carry out on each spark gap a forced sweeping of the insulating gas. This gaseous flow allows for better extinguishing of the electric arc which makes it possible to obtain a higher repeatability rate.

The zigzag configuration of the Marx generator according to the invention makes the generator more compact than according to prior art. Indeed, if z is the length along the axis Z of a capacitor provided with its two electrodes, the length along the axis Z of the Marx generator according to this invention is slightly less than N.z. The gain over the length along the axis Z is between 20% and 60% with respect to a conventional generator, wherein all of the capacitors are arranged along the same column and separated by a distance $z_i$ required for an inter-stage insulation and/or for housing the inter-stage spark gap. The length along the axis Z of a conventional generator is $N(z+z_i)$.

This configuration also makes it possible to reduce the parasite capacitive coupling between two consecutive stages, as such improving the sequencing of the closing of the spark gaps and the global electrical behaviour of the Marx generator.

This configuration also makes it possible to reduce the pulse rise time, by optimising the inductance $L_{MARX}$. The inductance $L_{MARX}$ is formed by the current loop that flows in the N stages of the Marx generator and which returns to the earth, via an ELR electrode, referred to as electrode for returning to earth.

Indeed, the pulse rise time is globally proportional to L/R, where L is the inductance resulting from the sum of the inductance of the generator $L_{MARX}$ and of the inductance of the charge $L_{Charge}$, and R is the resistance of the charge.

For a given charge, the parameters R and $L_{Charge}$ are fixed. It is therefore sought to minimise the inductance $L_{MARX}$ in order to reduce the duration of the pulse rising edge.

When the N stages are placed in series by the closing of the N spark gaps, the current flows successively, for n varying from 1 to N, in the capacitor Cn, in a connector electrode, in the spark gap En then in a second connector electrode.

The current return electrode ELR is generally formed by the metal enclosure wherein the Marx generator is housed. Alternatively, the current return electrode ELR can be a specific component of which the geometry and the position are chosen to optimise the current loop formed during the discharging of the Marx generator.

The distance between the current return electrode ELR and the circuit formed by the N stages of the generator affect the inductance $L_{MARX}$. This distance is reduced as much as possible, and the surface of the current return electrode ELR is greater than or equal to the surface of the discharging circuit formed by the N stages, i.e. the equivalent surface formed by the electrodes, capacitors and spark gaps wherein the current flows. However, the distance between the current return electrode ELR and the N stages must be sufficient to allow for the electrical insulation of the system during its various operating phases, in particular charging and discharging. This insulation distance depends on a certain number of parameters, such as for example the nature and the pressure of the dielectric gas, or the nature of the dielectric gas, or the electric fields linked to the geometries of the components and of the electrodes.

Alternatively, a dielectric film can be placed against the current return electrode ELR in order to reduce the insulation distance between this electrode and the N stages of the generator.

The inductance $L_{MARX}$ of the current loop is calculated by using the expression of the flow $\phi$:

$$\Phi = L_{MARX} I = \vec{B} d\vec{S}$$

Wherein I is the current, $\vec{B}$ is the magnetic induction vector and $d\vec{S}$ is the surface vector.

The inductance $L_{MARX}$ therefore depends on the magnetic induction vector, the surface vector and the current:

$$L_{MARX} = \vec{B} d\vec{S}/I$$

In the Marx generator according to the invention, the discharge current flows as a zigzag in the N stages, when the spark gaps are closed.

In the spark gaps, the current flows along an axis perpendicular to the axis Z, that is to say a horizontal axis in FIG. 1. The direction of the current in a spark gap is opposite the direction of the current in a neighbouring spark gap. The magnetic induction vectors induced respectively by the passage of the current in a spark gap and in a neighbouring spark gap are therefore of opposite directions, according to the axis Z.

In light of their proximity, the coupling between these two antagonist magnetic induction vectors is high. The magnetic induction on each spark gap is therefore substantially reduced. Consequently, the inductance of each spark gap is also substantially reduced.

The same applies for the electrodes that connect the spark gaps to the capacitors. Consequently, the inductance of these electrodes is also substantially reduced.

According to this invention, the zigzag flow of the discharge current in the N stages is therefore at the origin of the decrease in the inductance $L_{MARX}$ and makes it possible to reduce the pulse rise time.

Alternatively, the insulation distance between a stage and the current return electrode ELR is adapted to the level of voltage that the stage in question is subjected to. As such, the insulation distance is increasing from the stage of rank 1 which is in the vicinity of the earth to the stage of rank N, which is brought to a pulse voltage equal to the output voltage of the Marx generator.

The transmission line formed by the circuit of the N stages and by the current return electrode ELR then has an increasing impedance with the rank n.

Alternatively, the geometry of the transmission line formed by the circuit of the N stages and by the current return electrode ELR is adapted so that its impedance is increasing according to the rank n and reaches at the level of rank N a value equal to the impedance of the charge. A discharge rate similar to the theoretical discharge of a line on an adapted charge is then obtained. The pulse rising edge delivered then has a duration that is even further reduced.

By way of example, it is possible to obtain rising edges with a duration of less than 10 ns, without using a "peaking" device.

Figure 3A:
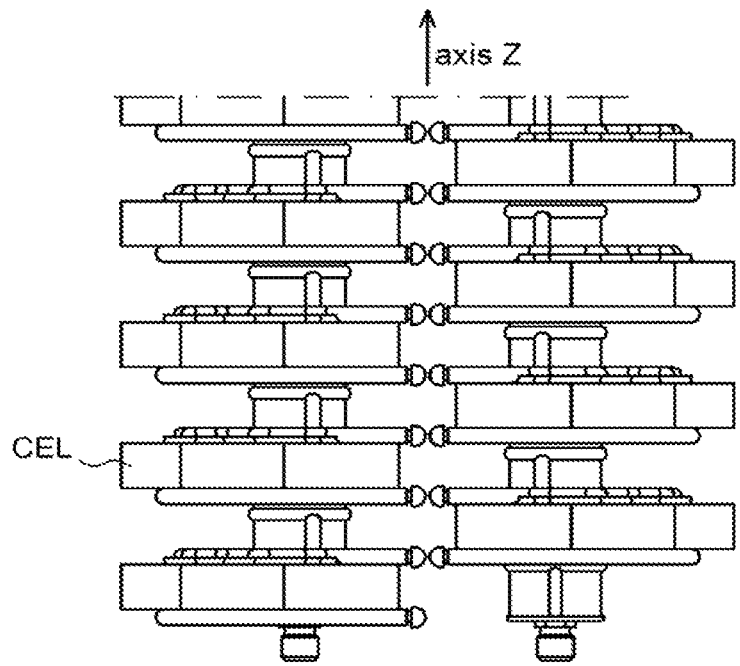
Figure 3B:
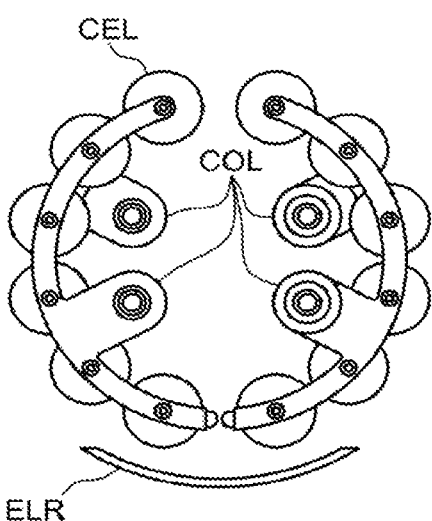
Figure 3C:
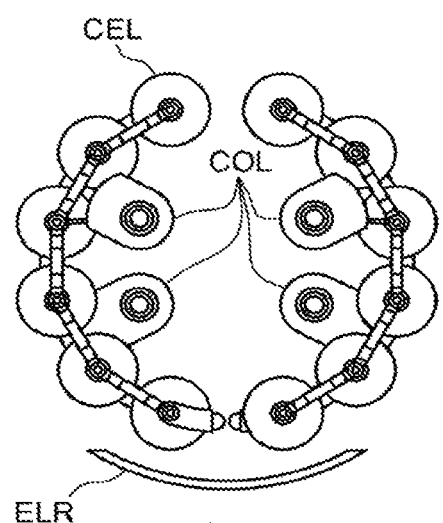

In reference to FIGS. 3a, 3b and 3c, a Marx generator according to a second embodiment of the invention is intended to deliver a crenel, plateau or rectangle pulse. FIGS. 3a, 3b and 3c respectively show the Marx generator seen from the side, bottom and top.

In order to obtain a crenel pulse, each stage of the first embodiment is modified in order to replace the capacitor with a network of cells (L, C). By way of example, the number of stages can be between 5 and 20, and the number of cells of a stage can be between 4 and 10. Other than this exception, all of the characteristics disclosed in relation with the first embodiment are in the second embodiment.

The network of cells (L, C) of a given stage comprises S cells CEL connected in series. Each cell comprises a capacitor of capacitance C and an inductance of value L. This network, also referred to as a PFN line, makes it possible to obtain a discharge of the crenel type on each stage. The amplitude of this crenel is multiplied when the N stages are placed in series by the quasi-instantaneous closing of the spark gaps.

The line of cells can be a straight line for example, or a curved line as shown in FIGS. 3a, 3b and 3c, in such a way as to hug the cylindrical geometry of the enclosure.

As in the first embodiment, the spark gaps are distributed on the axis Z, the stages are alternatively arranged on either side of the axis Z and the current return electrode ELR can be the metal enclosure of the Marx generator.

The duration $T_p$ of the crenel pulse is approximated by the formula:

$$T_p = 2S\sqrt{LC}$$

The impedance Z of each stage is approximated by the formula:

$$Z = \sqrt{L/C}$$

After closing of the N spark gaps, the impedance $Z_N$ of the Marx generator is approximated by the formula:

$$Z_N = N \cdot \sqrt{L/C}$$

The duration Tp of the crenel pulse can be adapted by modifying independently or in a combined manner the number of cells S, the value of the inductance L and the value of the capacitance C of each capacitor.

Alternatively, the cells (L, C) have a different inductance value and/or a different capacitance value in order to modify the profile of the pulse delivered. These differences can be made within the same stage and/or from one stage to the other.

Note that after the closing of the N spark gaps, the discharging circuit only entails the first of the S capacitors of each PFN line. The first capacitor is the capacitor closest to the spark gap.

The optimisation of the rising edge is therefore similar to that which has been described hereinabove.

For each stage, the PFN line comprises the S capacitors with their respective input electrode connected in line on the same electrode, referred to as input electrode of the PFN line. The output electrodes of two adjacent capacitors are connected via an inductance of value L.

Alternatively, the input electrodes of two adjacent capacitors are also connected via an inductance of value L. In this case, the equivalent inductance of each cell (L, C) has a value 2·L.

The capacitors are for example capacitors of the ceramic type with cylindrical geometry. These capacitors can have during their operation a piezo-electric effect that results in a slight shift in their electrodes. The capacitor/inductance assembly must therefore have a degree of flexibility so that at least one of the electrodes is not mechanically stressed under the effect of this shift. As such the risk of damage and premature ageing of the capacitors is reduced.

Different types of inductance can be used, for example coiled inductance on a ferromagnetic core, coiled inductance, curved wired inductance, linear wired inductance, or inductance of the flat line type.

These types are classed by decreasing values of inductance.

For example, in order to from an inductance of the flat line type, the respective electrode of the S capacitors is connected to a single electrode, the respective output electrode of the S capacitors is also connected to another single electrode. The inductance is then defined by the magnetised volume delimited by the contour between two adjacent capacitors and by these two electrodes.

Alternatively, each PFN line can be formed by a transmission line of the flat line type or of the coaxial line type. A transmission line of the flat line type comprises two electrodes separated by a dielectric material, without confinement of the magnetic field between the two electrodes. A transmission line of the coaxial line type comprises two electrodes separated by a dielectric material, with confinement of the magnetic field between the two electrodes.

Alternatively, several transmission lines can be connected in parallel on the same stage in order to reduce the impedance and increase the current delivered.

The charging circuit of the Marx generator comprises a set of elements which are either resistors or inductances. These elements are distributed around the stages.

In the case of operation in repetitive mode, the use of inductances makes it possible to minimise the losses during the charging of the capacitors.

According to the preferred embodiment shown in FIGS. 3a, 3b and 3c, the charge circuit comprises four inductance columns COL. An inductance column is connected to the input electrode of the odd-numbered capacitors, an inductance column is connected to the output electrode of the odd-numbered capacitors, an inductance column is connected to the input electrode of the even-numbered capacitors and an inductance column is connected to the output electrode of the even-numbered capacitors.

On the same column, the inductances are hollow and rigid elements, threaded and superposed on a single insulating rod of which the length is adapted to the length of the Marx generator according to the axis Z. Each insulating rod is a rigid element anchored on an element integral with the Marx generator, on the base of the N stages.

For each one of the even-numbered and odd-numbered capacitor columns, at least one electrode, input or output, is connected by a rigid connection to a charge inductance.

The assembly of insulating rods, inductance columns and capacitive columns provides a rigid structure for all of the N stages and allows for a precise positioning of each component within the Marx generator. This is then a self-supported structure that does not require support or an additional insulating device.

This self-supported structure minimises the solid insulating surfaces subjected to the differences in potential and which are zones of potential weakness with regards to losses and the risks of electrical breakdown. Note that only the surfaces of the insulating rods are subjected to the maximum voltage which is the output voltage of the generator during the discharging thereof. The risks of loss or of electrical breakdown are therefore reduced in light of the great length of the insulating rods. This structure therefore improves the reliability and the service life of the Marx generator.

This self-supporting structure contributes to the compactness and to the mechanical simplicity of the Marx generator. It facilitates the mounting and dismounting operations as well as maintenance operations.

It furthermore makes it possible to minimise the vibrations induced by the closing of the spark gaps during a burst of pulses, which improves the operating reliability.

Finally, it allows the system to undergo accelerations and/or vibrations which facilitates the transport and handling thereof. Operation on an on-board system, subjected to acceleration and/or vibrations is possible.

At these rigid connections, the electrodes can be split so as to block the flow of the eddy currents induced in the electrodes by the inductances of the charge circuit. This configuration makes it possible, during the discharging of the Marx generator, to optimise the inductive decoupling between stages provided by the inductance columns.

Alternatively, the charge circuit comprises resistors instead of the inductances.

Of course, self-supporting structure described applies to a Marx generator that comprises one capacitor per stage as well as a line of cells (L, C) per stage.

The output of the Marx generator is connected to the charge, either directly, or via a specific connector. Preferably, this connection is carried out by a transmission line of which the impedance is adapted to that of the charge. As such the duration of the rising edge of the pulse is not increased by this inductance.

The transmission line between the Marx generator and the charge is more preferably of coaxial structure. The insulation of the transmission line is provided by the same gas under pressure or the same dielectric liquid as that used for the insulation of the Marx generator. No support or solid insulating interface is used at the output of the generator or within the transmission line. The connection is therefore compact, simple and reliable.

Alternatively, the transmission line between the Marx generator and the charge is a high-voltage coaxial cable of which the impedance is adapted to that of the charge.

Thanks to this impedance adaptation, the length and the form of the transmission line have little or no influence on the characteristics of the pulses delivered by the Marx generator to the charge. It is as such possible to offset the charge remotely from the generator and/or to position the axis of the charge in an axis that is different from the one of the Marx generator.

List of patents relating to Marx generators:
US 20122001498
EP 1 760 884
U.S. Pat. No. 7,989,987
U.S. Pat. No. 6,060,791
U.S. Pat. No. 5,621,255
U.S. Pat. No. 4,900,947
U.S. Pat. No. 3,909,624
U.S. Pat. No. 3,863,105
DE 455 933

The invention claimed is:

1. A high-voltage pulse generator, comprising:
a plurality of stages and a current return electrode to ground connected in series, with each stage among the plurality of stages comprising at least one energy storage element connected in series with a spark gap, wherein
each spark gap is distributed on an axis,
odd-numbered energy storage elements are arranged on a first side of the axis,
even-numbered energy storage elements are arranged on a second side of the axis,
a circuit formed by the plurality of stages and the current return electrode has a reduced inductance during a discharge phase of the high-voltage pulse generator, with respect to another generator comprising the same components arranged along a conventional architecture, and
a dielectric film is arranged between the current return electrode and the circuit formed by the plurality of stages.

2. The high-voltage pulse generator according to claim 1, wherein an output of an upstream energy storage element, an upstream spark gap, and an input of a downstream energy storage element are substantially aligned, along another axis that is substantially perpendicular to the axis on which said each spark gap is distributed.

3. The high-voltage pulse generator according to claim 1, wherein electrodes of said each spark gap are directly connected to electrodes of the at least one energy storage element.

4. The high-voltage pulse generator according to claim 1, wherein all components of the generator are disposed in a closed metal enclosure that contains a dielectric fluid.

5. The high-voltage pulse generator according to claim 4, wherein the current return electrode is formed by the closed metal enclosure.

6. The high-voltage pulse generator according to claim 1, wherein the current return electrode has a surface greater than or equal to another surface formed by the circuit formed by the plurality of stages.

7. The high-voltage pulse generator according to claim 1, wherein a distance between the current return electrode and a stage among the plurality of stages increases with a rank of the stage.

8. The high-voltage pulse generator according to claim 7, wherein a distance between the current return electrode and a last stage among the plurality of stages is such that impedance for the last stage is equal to impedance of a charge circuit.

9. The high-voltage pulse generator according to claim 1, wherein the at least one enemy storage element comprises a capacitor.

10. The high-voltage pulse generator according to claim 1, wherein the at least one energy storage element comprises a cell formed from a capacitor and from an inductor.

* * * * *